(12) United States Patent
Verneau et al.

(10) Patent No.: US 10,338,122 B2
(45) Date of Patent: Jul. 2, 2019

(54) METHOD AND DEVICE FOR DETECTING A FAULT IN AN ELECTRICAL NETWORK

(71) Applicant: Schneider Electric Industries SAS, Rueil-Malmaison (FR)

(72) Inventors: Guillaume Verneau, Collonges au Mont d'Or (FR); Nathalie Baumes, Bressolles (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 136 days.

(21) Appl. No.: 15/170,147

(22) Filed: Jun. 1, 2016

(65) Prior Publication Data
US 2016/0370414 A1    Dec. 22, 2016

(30) Foreign Application Priority Data
Jun. 16, 2015  (FR) ..................... 15 55458

(51) Int. Cl.
*G01R 31/02* (2006.01)
*G01R 23/06* (2006.01)
(Continued)

(52) U.S. Cl.
CPC .............. *G01R 31/02* (2013.01); *G01R 19/04* (2013.01); *G01R 23/06* (2013.01); *G01R 31/025* (2013.01); *G01R 19/2506* (2013.01); *G01R 31/08* (2013.01)

(58) Field of Classification Search
CPC ...... G01R 31/02; G01R 23/06; G01R 31/025; G01R 19/04; G01R 31/08; G01R 19/2506
See application file for complete search history.

(56) References Cited

U.S. PATENT DOCUMENTS 4,885,656 A * 12/1989 Suzuki ................... G01R 19/04
361/86
2006/0215064 A1* 9/2006 Dawson ................. H03L 7/081
348/730
(Continued)

FOREIGN PATENT DOCUMENTS

EP        0 322 518 A1    7/1989

OTHER PUBLICATIONS

Vizireanu et al., Is "five-point" estimation better than "three-point" estimation? (Year: 2012).*
(Continued)

*Primary Examiner* — Mohammad K Islam
(74) *Attorney, Agent, or Firm* — Oblon, McClelland, Maier & Neustadt LLP (57) ABSTRACT

The invention relates to a method for detecting a fault in an electrical network (1) through which an AC current flows, the method comprising a step of acquiring three samples ($S_1$, $S_2$, $S_3$) of a sinusoidal signal (S) that is representative of the current flowing in the network (1), the acquisition of each sample being spaced apart by a fixed sampling time (T), a step of calculating an amplitude (A) of the signal (S), the calculation of the amplitude (A) depending solely on the three acquired samples ($S_1$, $S_2$, $S_3$) and being independent of the sampling time (T), a step of determining a fault if the calculated amplitude (A) is above a first predetermined threshold or if the calculated amplitude (A) is below a second predetermined threshold.

10 Claims, 4 Drawing Sheets

(51) Int. Cl.
*G01R 19/04* (2006.01)
*G01R 19/25* (2006.01)
*G01R 31/08* (2006.01)

(56) References Cited

U.S. PATENT DOCUMENTS

| | | | | |
|---|---|---|---|---|
| 2011/0013676 A1* | 1/2011 | Fukushima | .............. | H02H 3/30 375/211 |
| 2013/0332095 A1* | 12/2013 | Valtari | ............... | G01R 19/2509 702/60 |
| 2014/0104735 A1* | 4/2014 | Vanhala | .................... | H02J 3/40 361/85 |
| 2014/0358308 A1* | 12/2014 | Steckley | ................. | H02J 13/00 700/292 |
| 2015/0204935 A1* | 7/2015 | Klonowski | .......... | G01R 31/086 702/59 |
| 2016/0033580 A1* | 2/2016 | Qiao | .................... | G01R 31/343 324/765.01 |
| 2016/0202321 A1* | 7/2016 | Drame | ............... | G01R 31/3277 324/424 |
| 2016/0274169 A1* | 9/2016 | Cui | ...................... | G01R 31/025 |

OTHER PUBLICATIONS

Wu et al., Five-Point Amplitude Estimation of Sinusoidal Signals: With Application to LVDT Signal Conditioning (Year: 2010).*
French Preliminary Search Report dated May 9, 2016 in French Application 15 55458, filed on Jun. 16, 2015 ( with English Translation of categories of Cited Documents and Written Opinion).

* cited by examiner

METHOD AND DEVICE FOR DETECTING A FAULT IN AN ELECTRICAL NETWORK

TECHNICAL FIELD

The invention relates to a method for quickly detecting a fault, a ground fault or fault between phases for example, in a medium- or low-voltage electrical network. The electrical network may be either overhead or underground. This method is based on the analysis of the amplitude of a signal that is representative of the current flowing in the network. The invention also relates to a detection device that is capable of implementing this method.

PRIOR ART

Figure 1:
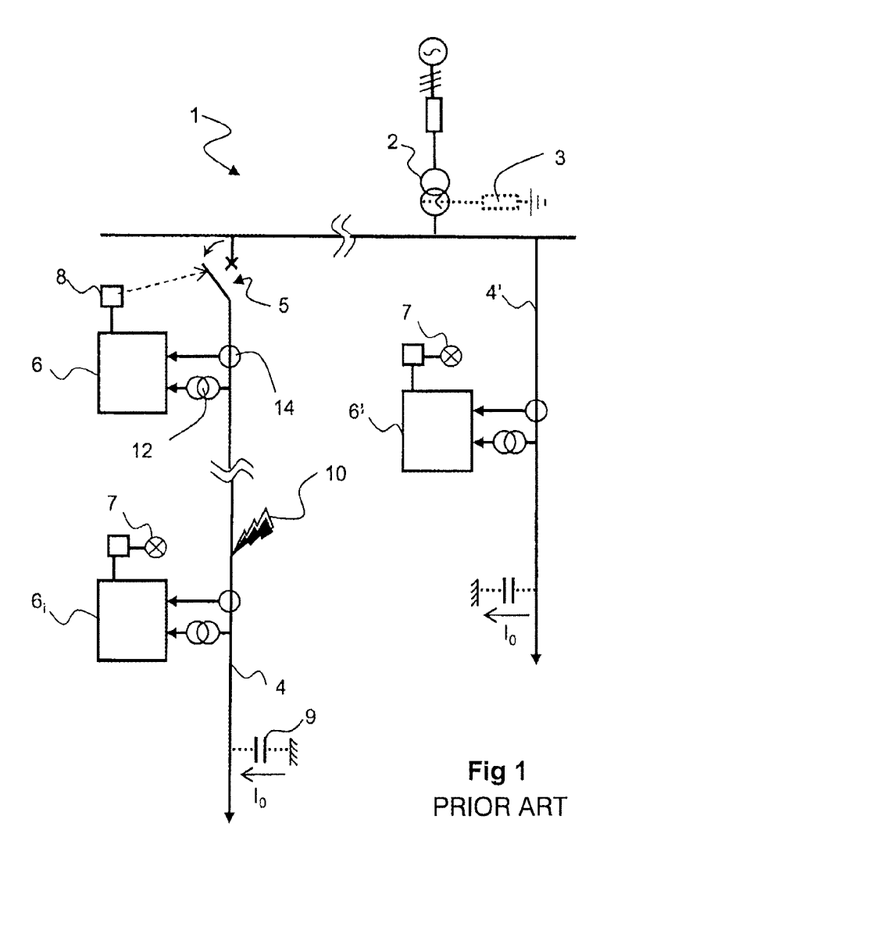
FIG. 1, already described above, shows an electrical network in which fault detection devices may be used.

Fault detection devices in three-phase electrical networks allow the protection for the loads to be tripped and/or help with locating said faults. For example, FIG. 1 shows a diagram of a medium-voltage electrical distribution network 1 comprising a three-phase transformer 2, the secondary of which may comprise a common neutral conductor that is generally connected to ground by an impedance 3, for example of Petersen coil type (in the case of a network with an isolated neutral, there is no physical connection between the neutral point of the network and ground). The secondary is additionally connected to a main distribution line that supplies power to outgoing lines 4, 4', some of which may comprise, at the head, a circuit breaker or other switching device 5 protecting them.

The outgoing lines 4, 4', composed of overhead lines and/or underground cables, may be subject to various faults and it is important that they are detected and located in order to mitigate the problems caused: power failure, deterioration of the withstand strength of the insulation materials, etc. A fault detection device 6i, 6', installed on the outgoing lines 4' or line sections 4, may serve to indicate the occurrence of a fault, by lighting up an indicator light 7, for example. Additionally, a device 6 may be combined with or integrated in a protection relay 8 that is capable of controlling the opening of the contacts of the circuit breaker 5.

Among these faults, the most common are single-phase faults, of short circuit type, that are located outside the source substation, in which one phase is in contact with ground, or an overhead cable breaks, especially in the event of bad weather. Furthermore, faults are also sometimes non-permanent or intermittent, in particular in overhead networks: some disappear naturally before the protection functions come into play, others are removed by a more or less slow restart cycle.

To take the potential necessary precautions or implement the devices that are adapted to characterizing and locating the fault, fault detection must be quick, of the order of a few milliseconds, or even less in the case of transient faults, and of course reliable.

In the management of medium-voltage (MV) and low-voltage (LV) distribution networks, the state of the network, of equipment or of industrial processes is conventionally monitored via the measurement of electrical quantities, such as voltages and intensities, that may be single phase or three phases depending on the context. This monitoring allows the state of the network, as well as the operating mode conditions (normal function or malfunction, linked, for example, to a current overload, short circuit or supply undervoltage etc.), to be determined.

In practice, two possibilities for carrying out this monitoring are distinguished:

monitoring hardware: via dedicated (voltage, current) sensors, an electronic measuring system allows the electronic signals that are representative of the monitored quantity to be compared with a predetermined threshold, via a comparator type setup. The advantage of this principle is its high rapidity in processing the measurement: the result of the comparison is almost obtained in real time. The disadvantage is that the comparison threshold is "set" by the material and does not allow the possibility of user adjustments, unless the electronic implementation makes provision for as many comparator circuits as there are conceivable thresholds or unless the electronics includes variable components (varistors, polyswitches, etc.), which are generally bulky and expensive. Furthermore, such a solution does not allow analyses, histories or sophisticated algorithms to be implemented.

monitoring software: after an input stage (voltage or current sensors), the measurements are sampled, filtered, digitized and are then subjected to signal processing by a microprocessor. The features (such as the amplitude, frequency, angular phase) of the electronic signal that is representative of the monitored electrical quantity are determined by conventional methods. Thus, it will be possible to calculate the amplitude by determining the RMS value of the signal (e.g. this may be done over an acquisition window of one or more network periods, this window possibly being fixed or sliding) or by using mathematical transforms (e.g. calculation of the direct component, via the use of Fortescue matrix to obtain the three-phase symmetrical components), or even by phasors. The advantage of this approach resides in particular in the flexibility of choice of the comparison threshold by the user, since the processing is purely software-based. The disadvantage of the approach resides in its "delayed" result: specifically, the calculation methods mentioned generally require the samples to be acquired over at least one network period before being able to be executed. However, this software-based approach is necessarily dependent on the specifications of the microprocessor and on the sampling frequency used: decreasing the number of samples allows processing time to be saved to the detriment of the precision of the result; increasing the number of samples favours the determination of precise results to the detriment of the responsiveness aspect.

In addition, the document EP0297418 describes a method for detecting frequency faults in an electrical network. In this method, multiple measurement samples of a signal to be analysed are used to calculate an estimated frequency. However, the method is recursive and in a closed loop, i.e. the calculation of the estimated frequency at an instant t also takes into account the estimated frequency at the preceding instant t−1 and will also be used for calculating the estimated frequency at the subsequent instant t+1. This method may therefore be complicated to implement, as it is necessary to know the preceding estimated frequency in order to calculate the new estimated frequency. Furthermore, as this method is recursive and in a closed loop, the time taken for converging towards the exact value of the calculated amplitude is non-negligible, thereby equally delaying the acquisition of a precise result. What is more, any interruption of the process, linked, for example, to opening the network, delays an "on the fly" resumption of the system when the network is re-energized: this convergence phase must once again be passed through, generating inertia. The same applies if there is a disruption, of electromagnetic type for example, skewing the measurement of a particular sample.

Document EP0322518 describes a method for detecting faults in a protection relay of an electrical network, which is based on the acquisition of three samples of the sinusoidal current flowing in the network, at a sampling frequency close to four times of the nominal frequency. However, the calculation of the current amplitude depends on the sampling frequency value, which depends on the current real frequency value. So it provides a more complex calculation and does not provide expected results, especially for detecting transitory faults.

However, in electrical distribution networks, in particular in medium-voltage networks, the detection of a malfunction must be able to be done very quickly in order to take the necessary precautions both for equipment and personnel. It is especially the case for equipment for protecting against and detecting faults of short circuit type (between phases or phase-ground), which must react in a few milliseconds so as to be able to manage these faults with very high responsiveness, or even to be able to pre-empt them. This detection is generally done by exceedence of a threshold (upper or lower) of a variable that is representative of the electric current. Thus, certain types of protection will monitor overcurrents, overvoltages or undervoltages, active/reactive power exceedences, etc.

Depending on the neutral regime type of the network, it is easier to see a fault from an overcurrent (direct neutral, resistive neutral) or from an overvoltage (isolated neutral) or a mixture of the two (compensated neutral). Aside from the type of fault, their nature is also differentiated: permanent fault (not removed by the restart cycle of the network) or non-permanent (removed before the end of this restart cycle).

In the rest of the document, the term "amplitude A" denotes the absolute value of the peak amplitude of a sinusoidal signal Z, of the type Z=A·sin(xt+y).

SUMMARY OF THE INVENTION

One of the aims of the invention is to propose a quick and simple method that allows a fault to be detected in an electrical network by analysing the amplitude of a signal (voltage or current) that is representative of the current flowing in the electrical network.

The invention aims to overcome some drawbacks of the existing fault detection devices and methods, and to optimize fault detection. By virtue of the invention, it may be possible to pre-empt a fault sufficiently quickly before it actually occurs.

To this end, the invention describes a method for detecting a fault in an electrical network through which an AC current flows. The method comprises a step of acquiring three samples of a sinusoidal signal that is representative of the current flowing in the network, the acquisition of each sample being spaced apart by a fixed sampling time, the sampling time corresponding to a sampling frequency being more than or equal to three times the nominal frequency. The method then comprises a step of calculating an amplitude of the signal, the calculation of the amplitude depending solely on the three acquired samples and being independent of the sampling time, then comprises a step of determining a fault if the calculated amplitude is above a first predetermined threshold or if the calculated amplitude is below a second predetermined threshold.

The invention also relates to a device for detecting a fault that is capable of implementing such a method for detecting a fault. The detection device comprises an acquisition module that is capable of obtaining three samples of a sinusoidal signal that is representative of the current flowing in the network, the acquisition of each sample being spaced apart by a fixed sampling time, a calculation module that is capable of calculating an amplitude of the signal, the calculation of the amplitude depending solely on the three samples acquired by the acquisition module and being independent of the sampling time, a fault determination module that is capable of determining a fault if the amplitude calculated by the calculation module is above a first predetermined threshold or if the calculated amplitude is below a second predetermined threshold.

According to one feature, the detection device comprises means for storing the three samples. The storage means may also store information relating to the detected faults.

The invention also relates to a protection relay for the purpose of monitoring an electrical network or any electrical switch unit that is connected to an electrical network comprising such a device for detecting faults in the electrical network.

BRIEF DESCRIPTION OF THE FIGURES

Other features and advantages will become more clearly apparent in the following description of particular embodiments of the invention, which are shown in the following appended figures.

DETAILED DESCRIPTION OF ONE EMBODIMENT

FIG. 1 shows a diagram of a medium-voltage electrical distribution network 1 comprising a three-phase transformer 2, the secondary of which may comprise a common neutral conductor that is generally connected to ground by an impedance 3. The secondary is additionally connected to a main distribution line that supplies power to outgoing lines 4, 4', some of which may comprise, at the head, a circuit breaker or other switching device 5 protecting them.

The outgoing lines 4, 4' are composed of overhead lines and/or underground cables and may be subject to various faults, and it is important that they are detected and located in order to mitigate the problems caused: power failure, deterioration of the withstand strength of the insulation materials, etc. Fault detection devices 6, 6i, 6', installed on the outgoing line 4' or line sections 4, serve to detect faults. Once a fault has been detected, the detection device 6 may comprise fault signalling means, such as a warning indicator 7, means for memorizing information relating, for example, to the presence of the fault, the type of fault and the duration of the fault. The detection device 6 may also comprise means for transmitting memorized fault information to a control station or a device for monitoring/controlling the electrical network 1.

Such a device 6 may also be integrated in a unit for monitoring all or part 4, 4' of the electrical network 1, in particular in a protection relay 8 that is capable of controlling the opening of the contacts of the circuit breaker 5, or may be directly implanted in a circuit breaker so as to be able to quickly open the line 4 of the electrical network 1 in the event of a fault.

Among these faults, the most common are single-phase faults, of short circuit type, that are located outside the source substation, in which one phase is in contact with ground, or an overhead cable breaks, especially in the event of bad weather. However, high capacitance values 9 may occur for example between the line conductors 4 and ground that result in large homopolar currents $I_0$ flowing in the event of a ground fault 10.

The homopolar current $I_0$ is zero in the absence of faults. The term "homopolar current" $I_0$ (or "zero sequence current") is understood to be, to a potential factor of close to three, the vector sum of the various phase currents, or even the current corresponding to the instantaneous resultant of the phase currents, sometimes called residual current, that potentially corresponds to the ground fault current or to the leakage current. It should be noted that it is possible to escape this situation, in particular with a non-zero homopolar current/voltage, and the network may comprise another number of phases; additionally, the neutral regime does not have to be compensated.

To detect the occurrence of a fault in an electrical network, it is known practice to measure, using sensors, at least one signal S that is representative of the current flowing in the portion of the network to be tested. This representative signal S may, for example, be the voltage between one of the phases and ground, the voltage between two phases, the current flowing in one of the phases or the current of the set of phases. In the absence of faults, the signal S is a sinusoidal signal of nominal amplitude $A_0$ and nominal frequency $f_0$, corresponding to the nominal frequency of the current flowing in the electrical network, e.g. 50 Hz or 60 Hz.

In the presented embodiment, to detect a fault 10 in the line 4, the detection device 6 comprises an acquisition module comprising a sensor that allows an analogue signal S that is representative of the current flowing in the line 4 to be acquired, such as, for example, a current sensor 14 or a voltage sensor 12.

Figure 2:
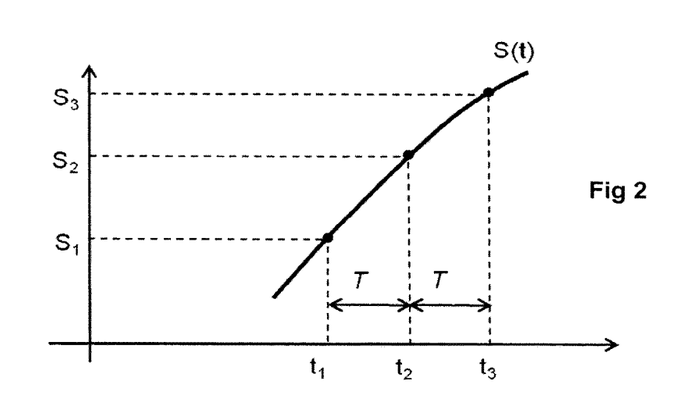
FIG. 2 shows an exemplary sampling of a signal that is representative of the current flowing in the electrical network.

The acquisition module is configured to obtain at least three samples S1, S2, S3 of the representative signal S, the acquisition of each signal being spaced apart by a fixed sampling time T. That is to say, as indicated in FIG. 2, if a first sample S1 is measured at a time t1, the second sample will be measured at a time t2=t1+T and the third sample will be measured at a time t3=t2+T=t1+2T.

For the requirements of the invention, the sampling time T must correspond to a sampling frequency F that is more than or equal to three times the nominal frequency $f_0$ of the signal S, thereby giving a sampling time T<=6.66 ms for a nominal frequency of 50 Hz of the electrical network 1.

Preferably, in order to accelerate the detection of a fault and to be capable of detecting extremely brief transient faults, a sampling frequency F that is equal to 1800 Hz is chosen, i.e. a sampling time T of 0.556 ms.

The acquisition module also comprises means, such as an analogue filter, for filtering the measurements carried out by the sensors 12 or 14, as well as sampling means allowing the signal S that is sampled to be obtained with the desired sampling time.

The detection device next comprises a calculation module that receives the successive samples originating from the acquisition module. The calculation module comprises storage means for memorizing various received samples of the signal S. These storage means allow at least three samples $S_1$, $S_2$, $S_3$ to be memorized, or allow samples of the signal S to be stored in a sliding manner for a longer duration.

According to the invention, the calculation module determines the amplitude A of the signal S simply on the basis of the values $S_1$, $S_2$, $S_3$. The sinusoidal signal S is of the form: $S(t)=A\cdot\sin(2\cdot\pi\cdot f\cdot t+\varphi)$, where A represents the amplitude, f the frequency and $\varphi$ the angular phase. Consequently, the three successive measurements S1, S2, S3 being spaced apart by T, it may be stated that:

$$S_1 = S(t_1) = S(t_2-T) = A\times\sin(2\cdot\pi\cdot f\cdot(t_2-T)+\varphi)$$

$$S_2 = S(t_2) = A\times\sin(2\cdot\pi\cdot f\cdot t_2+\varphi)$$

$$S_3 = S(t_3) = S(t_2+T) = A\times\sin(2\cdot\pi\cdot f\cdot(t_2+T)+\varphi)$$

Giving:

$$A = \sqrt{S_2^2 + \left(\frac{S_3 - S_1}{2\cdot\sin(2\cdot\pi\cdot f\cdot T)}\right)^2}$$

By means of a change of origin in order to carry out the abstraction of the angular phase $\varphi$ and the introduction of the angular frequency $\omega=2\cdot\pi\cdot f$, we get:

$$S_1 = A\times\cos(\omega\cdot t_2 - 2\cdot\pi\cdot f\cdot T)$$

$$S_2 = A\times\cos(\omega\cdot t_2)$$

$$S_3 = A\times\cos(\omega\cdot t_2 + 2\cdot\pi\cdot f\cdot T)$$

The trigonometric properties of the sine function then allow the following equation to be obtained:

$$S_1 + S_3 = 2\cdot S_2\cdot\cos(2\cdot\pi\cdot f\cdot T) \text{ where: } \cos(2\cdot\pi\cdot f\cdot T) = \frac{S_1 + S_3}{2\cdot S_2}$$

We therefore get:

$$A = \sqrt{S_2^2 + \left(\frac{S_3 - S_1}{2\cdot\sin\left(\text{Arccos}\left(\frac{S_1 + S_3}{2\cdot S_2}\right)\right)}\right)^2} \text{ where:}$$

$$A^2 = S_2^2 + \left(\frac{S_3 - S_1}{2\cdot\sin\left(\text{Arccos}\left(\frac{S_1 + S_3}{2\cdot S_2}\right)\right)}\right)^2$$

It is thereby shown that the calculation of the amplitude A depends only on three successive measured values, S1, S2, S3, without involving the frequency of the signal S or the sampling time T, without requiring previously calculated prior amplitude values to be known and without needing to mathematically model the system. The calculation method according to the invention is therefore advantageously non-recursive and non-iterative. Being independent of the sampling time T largely simplifies the calculation of the amplitude A. Moreover, when this sampling time depends on the real frequency of the signal, the sampling time must be re-calculated based on this real frequency to obtain the amplitude.

Thus, by assuming that the detection device measures a fourth sample S4 at an instant t4 that is equal to t2+2T, then the calculation module will directly re-calculate a new amplitude value A based only on the samples S2, S3, S4, without using the sample S1 or previously calculated amplitude values.

One of the points of interest of this method is therefore to be able to very quickly determine the amplitude of the signal S with only three samples, in contrast to approaches that generally require at least one network period in order to estimate this amplitude, and in contrast to iterative approaches that require a non-negligible time to converge towards an exact value and to refine the calculation of the amplitude. Thus, for example after restarting the electrical network following an interruption of the network, the "on the fly" resumption of the process is quickly achieved as soon as the three samples are measured, without having to pass through a convergence phase that generates inertia.

To more quickly and simply determine the amplitude A from the signal S based on the formula above, the calculation module may favour an approach based on finite expansions of the sine and arccosine trigonometric functions, or even of the square root function, thereby avoiding the requirement for overly large calculation means. Depending on the desired precision, the chosen sampling frequency and the specifications of the microprocessor that is integrated in the calculation module, the polynomial used in the finite expansions will be of the first to the fourth order. For example, a second-order finite expansion for a sampling frequency of 1800 Hz is used.

The detection device 6 next comprises a fault determination module that is capable of triggering a fault if the amplitude A calculated by the calculation module is above a first predetermined threshold M+, called the upper threshold (corresponding, for example, to an overcurrent) or if the calculated amplitude (A) is below a second predetermined threshold M−, called the lower threshold (corresponding, for example, to an undervoltage, or to a flicker type effect etc.). Preferably, the thresholds are centred on the nominal amplitude $A_0$ of the network.

The upper threshold may be set on the basis of the nominal amplitude $A_0$ to which a first margin or a first percentage of the nominal amplitude $A_0$ is added, and the lower threshold may be set on the basis of the nominal amplitude $A_0$ from which a second margin or a second percentage of the nominal amplitude $A_0$ is taken. For example, standard NF EN50-160 considers a MV (Medium Voltage) voltage to be functioning normally at −10%/+10% of its nominal value and a LV (Low Voltage) voltage to be functioning normally at −15%/+10% of its nominal value; beyond these permissible bands there is a malfunction.

Advantageously, the fault determination module may also memorize the type and the duration of a fault, in particular for being able to distinguish between permanent faults (not removed by the restart cycle of the network) and transient faults (removed before the end of this restart cycle).

Figure 3:
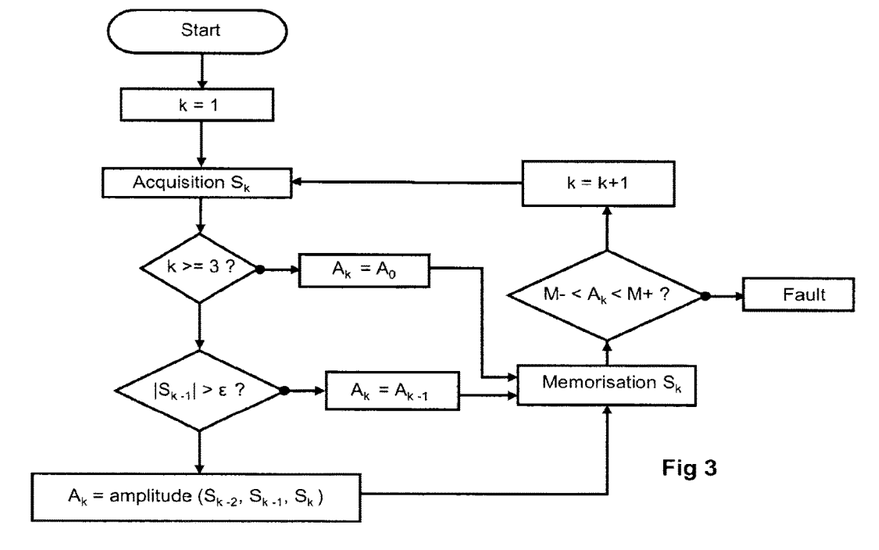
FIG. 3 shows, in a simplified manner, the detection method according to one preferred embodiment of the invention.

FIG. 3 gives a simplified flowchart of the method described in the invention. Upon starting a detection sequence or upon energizing the protection device, no sample S is yet memorized and an index k is initialized, for example, at the value 1. The protection method then makes provision for carrying out a measurement $S_k$ of the signal S, which measurement is filtered and digitized.

While the index k is smaller than 3, meaning that three successive samples are yet to be acquired, the detection method is not capable of detecting a fault and therefore forces the calculated amplitude A to the nominal value $A_0$, for example, of the signal S. Conversely, as soon as k is greater than or equal to 3, then the amplitude $A_k$ is calculated as being a function of the three last successive samples $S_{k-2}$, $S_{k-1}$, $S_k$, according to the algorithm described above.

Next, the detection method memorizes the value of the sample $S_k$ in the storage means of the detection device and incrementally increases the index k at each sampling time T before carrying out a new cycle, with the measurement of a new sample $S_k$ and a new calculation of the amplitude $A_k$. Thus, the calculation of the amplitude is regularly updated at each sampling time T.

Then, to determine the presence of a fault, the detection method passes through a determination step in which it is detected whether the calculated amplitude $A_k$ is above the first predetermined threshold M+ or whether the calculated amplitude $A_k$ is below the second predetermined threshold M− in order to determine whether the amplitude $A_k$ is within a permissible band.

Optionally, in order to avoid dividing by a number too close to zero, which could cause calculation errors, the detection method makes provision for carrying out a test on the value of the median sample, namely $S_{k-1}$ if the three samples are $S_{k-2}$, $S_{k-1}$, $S_k$ (or $S_2$ if the samples are $S_1$, $S_2$, $S_3$), as the value of the median sample is used as the denominator in the proposed formula. Hence if the absolute value of the median sample $S_{k-1}$ is below or equal to a minimum threshold ε, then the amplitude $A_k$ is not calculated but remains equal to the preceding calculated value $A_{k-1}$. For example, the minimum threshold E is of the order of 0.2% of the nominal value $A_0$ of the signal S.

Figure 4A:
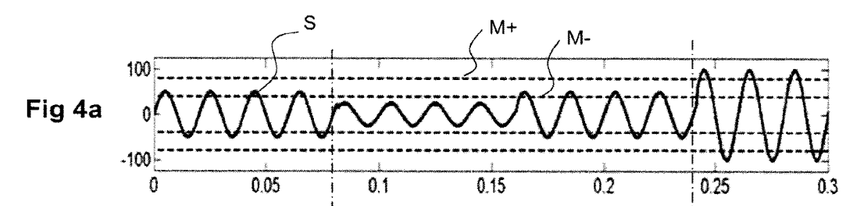
FIGS. 4a to 4d illustrate an example with four diagrams showing a signal S and fault detection measurements according to the method of the invention and other methods.

The graph of FIG. 4a shows, for a duration of 300 ms (scale of the abscissae x-axis in seconds), a first example of a sinusoidal signal S to be monitored as a function of time, as well as the representation of an upper fixed threshold M+ and a lower fixed threshold M−. On this graph, the nominal amplitude $A_0$ of the signal S is equal to 50, where, in this example, M+ is equal to 80 and M− is equal to 40. At the beginning of the graph, it may be seen that the amplitude of the signal S is substantially equal to $A_0$, namely the signal S oscillates between −50 et +50. Then, in the middle of the graph, the amplitude of the signal S decreases to pass below the value of the lower threshold M− and, at the end of the graph, increases to pass above the value of the upper threshold M+.

Figure 4B:
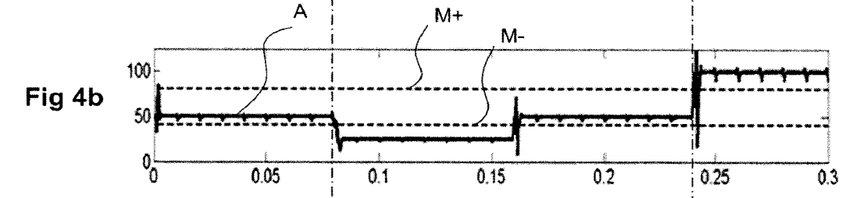
Figure 4C:
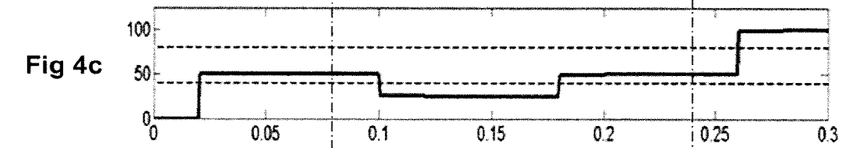
Figure 4D:
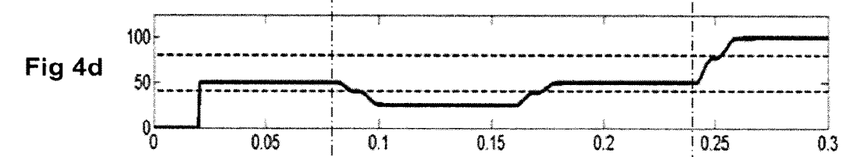

FIGS. 4b to 4d compare three exemplary calculations of the amplitude A of the same signal S, carried out at one and the same sampling frequency that is equal to 1800 Hz. The graph of FIG. 4b shows the result of the calculation of the amplitude according to the detection method of the invention, with second order for the finite expansions of the trigonometric functions. The graph of FIG. 4c shows a result using a method based on a fixed-window RMS (root mean square) calculation and that of FIG. 4d shows a result using a method based on a sliding-window RMS calculation.

FIG. 4b clearly shows that the method of the invention gives a result more quickly than the other methods of FIGS. 4c to 4d, both for detecting a crossing of the lower threshold M− and detecting a crossing of the upper threshold M+.

The graphs of FIGS. 5a to 5d detail a second example that more precisely illustrates that the method according to the invention is also capable, in certain cases (in particular following the instant at which the amplitude of the signal S diverges from the nominal sinusoid), of detecting an amplitude exceedence of the signal S even before this threshold exceedence actually occurs. The method thus allows the occurrence of a fault to be predicted, thereby providing multiple advantages. Specifically, this information predicting an amplitude exceedence is used by a range of equipment (e.g. protection relays, circuit breakers at the head of outgoing lines, etc.). It may also be sent as a priority to a monitoring system (GOOSE type message in IEC61850). It may thus be envisaged: to preventively open the outgoing circuit in question and hence minimize material damage and risks to personnel; to limit the imminent fault current, if the grounding of the neutral of the secondary of the transformer is a dynamically slaved Petersen coil, for example; to minimize the duration of the post-fault interruption by preparing the reconfiguration of the network after isolating the section with a fault.

FIG. 5 details, for a duration of 100 ms, a sinusoidal signal S to be monitored and an upper fixed threshold M+ that is equal to 80. As for FIGS. 4b to 4d, FIGS. 5b to 5d compare three exemplary calculations of the amplitude A of the signal S of FIG. 5a, carried out at one and the same sampling frequency that is equal to 1800 Hz. FIG. 5b shows the result of the calculation of the amplitude according to the detection method of the invention, with second order for the finite expansions of the trigonometric functions. FIG. 5c shows a result using a method based on a fixed-window RMS calculation and FIG. 5d shows a result using a method based on a sliding-window RMS calculation.

Figure 5A:
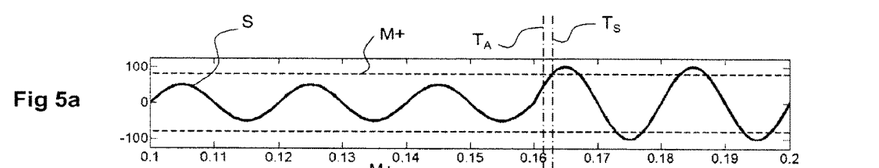
FIGS. 5a to 5d illustrate another example comparing the method of the invention and other methods.
Figure 5B:
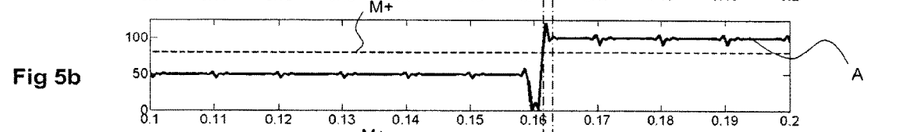
Figure 5C:
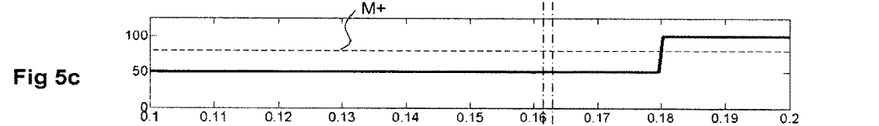
Figure 5D:
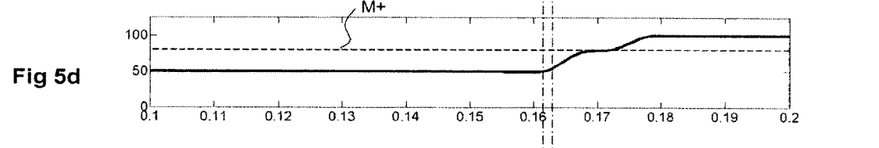

In FIG. 5a, it may be seen that the crossing of the upper threshold M+ by the signal S takes place at an instant denoted by $T_S$. In FIG. 5b, it may be seen that the amplitude A calculated according to the method of the invention crosses this upper threshold M+ at an instant denoted by $T_A$. In this example, it may actually be noted that the instant $T_A$ comes before the instant $T_S$, by about 1.5 ms.

The invention also covers an electrical unit comprising such a protection device, in such a way as to be able to interrupt the electrical network in the event of a fault. Specifically, the protection device of the invention may be implanted in various types of unit, such as, for example, a protection relay, a circuit breaker or switch or a remote monitoring/control station.

In a unit, the protection device described in the invention may also potentially be combined with another device that monitors, for example, the frequency of the current flowing in the electrical network, in such a way that the decision-making takes into account the overall set of results obtained by the various devices.

For monitoring a polyphase, e.g. three-phase, electrical network, an electrical unit preferably comprises a protection device for each of the three phases.

The invention claimed is:

1. A method for detecting and protecting against a fault in an electrical network through which an AC current of nominal frequency flows, the method comprising:
    acquiring, with an analog sensor, a sinusoidal signal that is representative of the current flowing in the network;
    filtering, with an analog filter, the sinusoidal signal;
    sampling the filtered sinusoidal signal with a fixed sampling time to provide three sample measurement values $S_1$, $S_2$, and $S_3$, the acquisition of each sample being spaced apart by the sampling time, the sampling time corresponding to a sampling frequency being more than or equal to three times the nominal frequency, the sample measurement value $S_2$ being acquired intermediately in time between the sample measurement values $S_1$ and $S_3$;
    calculating an amplitude of the signal, the calculation of the amplitude depending solely on the three acquired samples, being performed using a quotient formed from the three acquired sample measurement values, and being independent of the sampling time, wherein when an absolute value of $S_2$ is below or equal to a minimum threshold, during the step of calculating, the amplitude of the signal remains equal to a preceding calculated value;
    determining the fault if the calculated amplitude is above a first predetermined threshold or if the calculated amplitude is below a second predetermined threshold; and
    controlling the network to protect against the fault by at least one of opening a circuit in the network, limiting an imminent fault current, or reconfiguring the network to minimize a duration of a post-fault interruption.

2. The method for detecting and protecting against the fault according to claim 1, wherein the first threshold is set by a nominal amplitude of the signal to which a first margin or a first percentage of the nominal amplitude is added, and the second threshold is set by the nominal amplitude of the signal from which a second margin or a second percentage of the nominal amplitude is taken.

3. The method for detecting and protecting against the fault according to claim 1, in which the fixed sampling time corresponds to a sampling frequency being equal to 1800 Hz.

4. The method for detecting and protecting against the fault according to claim 1, in which the calculation of the amplitude uses the following formula:

$$A = \sqrt{S_2^2 + \left(\frac{S_3 - S_1}{2 \cdot \sin\left(\text{Arccos}\left(\frac{S_1 + S_3}{2 \cdot S_2}\right)\right)}\right)^2},$$

where A is the amplitude.

5. The method for detecting and protecting against the fault according to claim 1, in which said controlling the network to protect against the fault comprises said reconfiguring the network to minimize the duration of the post-fault interruption.

6. A device for detecting and protecting against a fault in an electrical network through which an AC current of nominal frequency flows, the device comprising:
    circuitry configured to
    acquire, with an analog sensor, a sinusoidal signal that is representative of the current flowing in the network;
    filter, with an analog filter, the sinusoidal signal;
    sample the filtered sinusoidal signal with a fixed sampling time to provide three sample measurement values $S_1$, $S_2$, and $S_3$, the acquisition of each sample being spaced apart by the sampling time, the sampling time corresponding to a sampling frequency being more than or equal to three times the nominal frequency, the sample measurement value $S_2$ being acquired intermediately in time between the sample measurement values $S_1$ and $S_3$;
    calculate an amplitude of the signal, the calculation of the amplitude depending solely on the three acquired sample measurement values, being performed using a quotient formed from the three acquired sample measurement values, and being independent of the sampling time, wherein when an absolute value of $S_2$ is below or equal to a minimum threshold, during the calculating, the amplitude of the signal remains equal to a preceding calculated value;

determine the fault if the calculated amplitude is above a first predetermined threshold or if the calculated amplitude is below a second predetermined threshold; and control the network to protect against the fault by at least one of opening a circuit in the network, limiting an imminent fault current, or reconfiguring the network to minimize a duration of a post-fault interruption.

7. The device for detecting and protecting against the fault according to claim 6, wherein the circuitry is configured to store the three sample measurement values $S_1$, $S_2$, $S_3$.

8. The device for detecting and protecting against the fault according to claim 6, wherein the circuitry comprises a protection relay and is configured to control the protection relay to protect the network against the fault.

9. The device for detecting and protecting against the fault according to claim 6, wherein the circuitry comprises an electrical switch connected to the network and is configured to control the electrical switch to protect the network against the fault.

10. The device for detecting and protecting against the fault according to claim 6, wherein the circuitry is configured to control the network to protect against the fault by said reconfiguring the network to minimize the duration of the post-fault interruption.

* * * * *